United States Patent [19]

Shaheen

[11] 4,233,103
[45] Nov. 11, 1980

[54] HIGH TEMPERATURE-RESISTANT CONDUCTIVE ADHESIVE AND METHOD EMPLOYING SAME

[75] Inventor: Joseph M. Shaheen, La Habra, Calif.

[73] Assignee: The United States of America as represented by the Secretary of the Air Force, Washington, D.C.

[21] Appl. No.: 971,580

[22] Filed: Dec. 20, 1978

[51] Int. Cl.² .......................... C09J 5/00; B32B 31/00
[52] U.S. Cl. ...................................... 156/331; 29/589; 75/134 T; 156/299; 252/511; 252/514; 260/37 M; 428/328; 428/554; 428/473.5; 528/335; 228/123; 228/238
[58] Field of Search ................................ 156/299–331; 428/328–473.5; 260/37 M; 528/335; 29/589; 252/511–514; 75/135 T

[56] References Cited
U.S. PATENT DOCUMENTS

| 3,073,784 | 1/1963 | Endrey | 252/514 |
| 3,576,691 | 4/1971 | Meyers | 156/331 |
| 3,677,974 | 7/1972 | Kilduff | 252/514 |
| 4,147,669 | 4/1979 | Shaheen et al. | 252/514 |

OTHER PUBLICATIONS

Melan et al., "Electrically Conductive Adhesive", IBM Technical Disclosure Bulletin, vol. 8, No. 9, 2–1966.

Primary Examiner—John J. Gallagher
Attorney, Agent, or Firm—Joseph E. Rusz; Cedric H. Kuhn

[57] ABSTRACT

A high temperature-resistant, conductive adhesive composition for bonding a semiconductor die to a substrate comprising a mixture of (1) an alloy of gallium-tin eutectic and gold and (2) a polyimide resin.

5 Claims, No Drawings

HIGH TEMPERATURE-RESISTANT CONDUCTIVE ADHESIVE AND METHOD EMPLOYING SAME

RIGHTS OF THE GOVERNMENT

The invention described herein may be manufactured and used by or for the Government of the United States for all governmental purposes without the payment of any royalty.

FIELD OF THE INVENTION

This invention relates to a high temperature-resistant, conductive adhesive for bonding a semiconductor die to a substrate. In one aspect it relates to a method for bonding a semiconductor die to a substrate.

BACKGROUND OF THE INVENTION

The attachment of semiconductor dies or chips to a substrate requires a bonding material which will withstand long periods of exposure to temperatures as high as 250° C. Also, the material must display low outgassing at the elevated temperatures while providing a high bond strength. Epoxy-based die bonding agents presently available lose significant bond strength when exposed to the elevated temperatures. Eutectic die bonding agents require the disposition of a metal on the reverse side of the die to provide a bonding surface for the eutectic alloy. The process for depositing the metal is expensive and time consuming in that it adds an additional step to the bonding procedure.

It is an object of this invention to provide a composition which is an effective bonding material for attaching semiconductor dies to substrates.

Another object of the invention is to provide a formulation for use in bonding dies to substrates.

Another object of the invention is to provide a method for bonding a die to a substrate.

Other objects and advantages of the invention will become apparent to those skilled in the art upon consideration of the accompanying disclosure.

SUMMARY OF THE INVENTION

The present invention resides in a high temperature-resistant, conductive adhesive composition for bonding a semiconductor die to a substrate. Broadly speaking, the composition comprises a mixture of (1) an alloy of gallium-tin eutectic and gold and (2) a polyimide resin. More specifically, the composition comprises (1) an alloy containing about 20 to 80 weight percent of gallium-tin eutectic and about 80 to 20 weight percent gold, based on a total of 100 weight percent, and (2) about 1 to 10 weight percent polyimide resin, based upon the weight of the alloy. As is well known, the gallium-tin eutectic contains 89 weight percent gallium and 11 weight percent tin.

The composition of this invention is formulated by dispersing the alloy in a solution of the resin. In one procedure, initially the eutectic mixture of gallium and tin is prepared. This preparation is accomplished by first heating the gallium to above its melting point and then stirring 11 weight percent tin into the melted material. The gallium-tin eutectic composition that is formed is then allowed to cool to room temperature. The resin solution is prepared by adding while stirring an appropriate amount of the polyimide, which is conveniently in the form of a powder, to a solvent for the resin. To facilitate complete solvation, the solvent is desirably heated to a temperature below its boiling point. In general, the amount of solvent used is that which is sufficient to provide a formulation having a paste-like consistency that can be readily applied, e.g., by means of a brush, to a surface. A 25 to 75 percent solution usually provides a formulation that meets this requirement. A mixture of the eutectic composition and gold powder in measured amounts is triturated until the gold is dissolved. The resin solution is then added to the alloy of gallium-tin eutectic and gold, and the resulting composition is stirred until a homogeneous mixture is obtained. The composition of this invention that is obtained has a paste-like consistency so that it can be readily spread to provide a thin adhesive coating.

The polyimide resins are well known materials that are available from commercial sources. A particularly suitable resin is Kermid 601 polyimide resin, a product of Rhodia, Inc., 600 Madison Ave., New York, N.Y. The product is an addition type polyimide resin prepared by reacting a bis-maleimide with an aromatic diamine. Pyre-ML and Pyralin polyimide materials sold by E. I. Dupont de Nemours and Co., Wilmington, Del., can also be employed. Furthermore, polyimide materials suitable for use in preparing the present composition are disclosed in U.S. Pat. No. 3,179,634. Any of the well known solvents for polyimide resins can be used in preparing the resin solution, but it is often preferred to utilize N-methylpyrrolidone or dimethylformamide. Also, the polyimide resin is often furnished by the supplier in the form of a solution or varnish.

In general, the composition of this invention can be used to bond semiconductor dies or chips to substrates. For example, the composition is eminently suitable for use in fabricating microcircuits whereby sapphire, silicon on sapphire (SOS) and silicon dies are attached to a ceramic substrate, thereby providing a high temperature-resistant, low outgassing die bond.

In a preferred procedure for bonding a die to a substrate, a thin film or coating of the adhesive formulation described above is applied to the substrate. Transfer of the formulation to the substrate can be accomplished by stamping or painting. The die is then positioned in contact with the film and pressed firmly in place. Finally, the adhesive material is cured by heating the assembly. During the curing period, the resin solvent evaporates, leaving the above-defined composition as the solid bond material. The curing conditions employed are often based on information furnished by the supplier of the polyimide resin. In a typical curing operation, the assembly is baked at 180° F. (82.2° C.) for 10 minutes, cured at 350° F. (176.7° C.) for 1 hour, and postcured at 482° F. (250° C.) for 1 hour.

A more complete understanding of the invention can be obtained by referring to the following illustrative examples which are not intended, however, to be unduly limitative of the invention.

EXAMPLE I

A run was conducted in which a formulation of the conductive adhesive composition of this invention was prepared. A eutectic mixture of gallium and tin was made initially by heating the gallium to above its melting point and then stirring 11 weight percent tin into the melted metal. The eutectic consisting of 89 weight percent gallium and 11 weight percent tin was then allowed to return to room temperature.

A solution of Kermid 601 polyimide resin in N-methylpyrrolicone was prepared by heating the solvent to 125° F. (51.7° C.) and stirring in the powdered resin until complete solvation of the resin had occurred. Resin was continually added until a 50 percent solution was obtained after which the material was allowed to return to room temperature.

A mixture consisting of 47.1 weight percent (48.5 parts by weight) of the eutectic and 47.1 weight perc-;ent (48.5 parts by weight) gold powder was then measured and triturated until the gold had dissolved. To the liquid paste material obtained there was added 5.8 weight percent (6.0 parts by weight) of the resin solution. The resulting formulation was mixed until an even distribution of all components was obtained. The following is the recipe used in preparing the formulation:

| Component | Wt.% | Parts by Wt |
|---|---|---|
| Eutectic | 47.1 | 48.5 |
| Gold | 47.1 | 48.5 |
| Resin solution | 5.8 | 6.0 |

EXAMPLE II

Several SOS chips ranging in size from 0.050 inch square to 0.125 inch by 0.175 inch were bonded to an alumina substrate using the adhesive composition prepared in Example I. The adhesive was applied to the substrate as a thin film using a printed circuit board touch-up brush. Each die was then positioned in contact with the adhesive film and pressed firmly in place. Curing of the adhesive composition was carried out in accordance with the following schedule:

15 minutes at 180° F. (82.2° C.)
1 hour at 350° F. (176.7° C.)
1 hour at 500° F. (260° C.)

No outgassing was observed at the elevated postcure temperature. The adhesive material after curing and evaporation of the solvent had the following composition:

| Component | Wt. % |
|---|---|
| Eutectic | 48.5 |
| Gold | 48.5 |
| Polyimide resin | 3.0 |
| | 100.0 |

The bond strength of the specimens were determined before and after heat aging for 150 hours at 500° F. The tensile shear results are shown below in the table.

TABLE

| Tensile shear, psi | |
|---|---|
| Initial | 3780 |
| After 150 hrs at 500° F. | 3440 |

EXAMPLE III

A run was conducted in which resistivity measurements were made before and after heat aging on a cast line (test specimen) of the adhesive material prepared as described in Example I. In the procedure followed, pads of copper wire were placed about 1.5 inches apart on an insulative substrate. Two parallel strips of tape were placed about 0.125 inch apart to form a path connecting the pads. The conductive adhesive was squeezed into the path and halfway across the two pads. The tape was then removed and the adhesive composition was cured.

Measurement of the resistance between the two pads in ohms was made. The length, width and thickness of the conductive path between the pads were measured in centimeters. The volume resistivity was calculated from the following equation:

$$P = \frac{R(w \times t)}{l},$$

where
p = volume resistivity in ohm-cm,
R = measured resistance, ohms,
w = width of conductive path, cm,
t = thickess of conductive path, cm,
l = length of conductive path, cm.

The results obtained are set forth below in the table.

TABLE

| Initial | .000058 ohm-cm |
|---|---|
| After 150 hrs at 350° F. | .00015 ohm-cm |
| After 150 hrs at 500° F. | .000085 ohm-cm |

As seen from the foregoing, the present invention provides an adhesive composition which is very effective in bonding semiconductor dies to a substrate. The composition exhibited a high shear strength both before and after heat aging, thereby demonstrating its resistance to elevated temperatures. The resistivity values show that the adhesive composition is a conductive material.

As will be evident to those skilled in the art, modifications of the present invention can be made in view of the foregoing disclosure without departing from the spirit and scope of the invention.

I claim:

1. A method for bonding a semiconductor die to a substrate which comprises applying to the substrate a film of an adhesive formulation comprising an alloy of gallium-tin eutectic and gold dispersed in a solution of a polyimide resin; positioning a semiconductor die in contact with the film; pressing the die firmly in place; and curing the adhesive formulation to a solid bond material.

2. The method according to claim 1 in which the adhesive formulation comprises (1) an alloy containing about 20 to 80 weight percent of gallium-tin alloy and 80 to 20 percent gold, based on a total of 100 weight percent, and (2) about 1 to 10 weight percent polyimide resin, based upon the weight of the alloy.

3. A high temperature-resistant, conductive adhesive composition comprising a mixture of (1) an alloy of gallium-tin eutectic and gold and (2) a polyimide resin.

4. The compositionn according to claim 3 which comprises (1) an alloy containing about 20 to 80 weight percent of gallium-tin eutectic and 80 to 20 weight percent gold, based on a total of 100 weight percent, and (2) about 1 to 10 weight percent polyimide resin, based upon the weight of the alloy.

5. The composition according to claimm 4 which comprises 48.5 weight percent eutectic, 48.5 weight percent gold and 3 weight percent polyimide resin.

* * * * *